United States Patent
Sung et al.

(10) Patent No.: US 8,493,799 B2
(45) Date of Patent: Jul. 23, 2013

(54) SEMICONDUCTOR MEMORY DEVICE, SEMICONDUCTOR MEMORY MODULE AND SEMICONDUCTOR MEMORY SYSTEM INCLUDING THE SEMICONDUCTOR MEMORY DEVICE

(75) Inventors: Myung-hee Sung, Hwaseong-si (KR); Jong-hoon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 315 days.

(21) Appl. No.: 12/833,444

(22) Filed: Jul. 9, 2010

(65) Prior Publication Data
US 2011/0110168 A1 May 12, 2011

(30) Foreign Application Priority Data
Nov. 9, 2009 (KR) ........................ 10-2009-0107514

(51) Int. Cl.
*G11C 7/02* (2006.01)
(52) U.S. Cl.
USPC .................................................... 365/189.09
(58) Field of Classification Search
USPC ..................................................... 365/189.09
See application file for complete search history.

(56) References Cited

U.S. PATENT DOCUMENTS

| | | | |
|---|---|---|---|
| 6,273,759 B1 * | 8/2001 | Perino et al. .................. | 439/631 |
| 6,839,786 B2 | 1/2005 | Kim et al. | |
| 7,716,401 B2 | 5/2010 | Lee | |
| 2002/0194416 A1 | 12/2002 | Kim et al. | |
| 2003/0035328 A1 * | 2/2003 | Hamamatsu et al. ......... | 365/200 |
| 2004/0071023 A1 * | 4/2004 | Tanaka .......................... | 365/200 |
| 2005/0210175 A1 * | 9/2005 | Lee ............................... | 710/305 |
| 2006/0132179 A1 * | 6/2006 | Kim ............................... | 326/82 |
| 2007/0161264 A1 * | 7/2007 | Lee et al. ........................ | 439/64 |
| 2008/0183959 A1 * | 7/2008 | Pelley et al. .................. | 711/109 |
| 2008/0307170 A1 * | 12/2008 | Lee ............................... | 711/149 |
| 2009/0080266 A1 | 3/2009 | Zumkehr | |

FOREIGN PATENT DOCUMENTS

| KR | 100391990 | 7/2003 |
|---|---|---|
| KR | 100539252 | 12/2005 |

* cited by examiner

*Primary Examiner* — Hoai V Ho
*Assistant Examiner* — Min Huang
(74) *Attorney, Agent, or Firm* — Onello & Mello, LLP

(57) ABSTRACT

A semiconductor memory device, a semiconductor memory module, and a semiconductor memory system including the same, the semiconductor memory device including a command/address input buffer that receives a command/address signal and a command/address reference voltage signal, wherein the command/address input buffer is configured to amplify a difference between the command/address signal and the command/address reference voltage signal, and is further configured to output the amplified difference between the command/address signal and the command/address reference voltage signal, and a chip selection input buffer that receives a chip selection signal and a chip selection reference voltage signal, wherein the chip selection input buffer is configured to amplify a difference between the chip selection signal and the chip selection reference voltage signal, and is further configured to output the amplified difference between the chip selection signal and the chip selection reference voltage signal, wherein a voltage level of the command/address reference voltage signal is different from a voltage level of the chip selection reference voltage signal.

22 Claims, 6 Drawing Sheets

SEMICONDUCTOR MEMORY DEVICE, SEMICONDUCTOR MEMORY MODULE AND SEMICONDUCTOR MEMORY SYSTEM INCLUDING THE SEMICONDUCTOR MEMORY DEVICE

CROSS-REFERENCE TO RELATED APPLICATIONS

This application claims the benefit of Korean Patent Application No. 10-2009-0107514, filed on Nov. 9, 2009, in the Korean Intellectual Property Office, the disclosure of which is incorporated herein in its entirety by reference.

TECHNICAL FIELD

The present inventive concepts generally relate to semiconductor memory devices, semiconductor memory modules, and semiconductor memory systems including the semiconductor memory devices, and more particularly, to semiconductor memory devices, semiconductor memory modules, and semiconductor memory systems including the semiconductor memory devices in which a command/address reference voltage signal and a chip selection reference voltage signal that are input to the semiconductor memory device have different voltage values.

BACKGROUND

Conventional memory modules may comprise a plurality of memory cells or devices having termination resistors connected thereto. In this regard, when a termination resistance value of a termination resistor is connected to a bus for transmitting a signal, the signal may vary according to a configuration of the termination resistor, a resistance value of the termination resistor, and a connection status of one or more other memory modules. As a result, a swing range of the signal may also vary, and therefore, it may be necessary to change a value of a reference voltage for determining the logic state of the signal.

SUMMARY

Embodiments of the present inventive concepts are directed to semiconductor memory devices, semiconductor memory modules, and semiconductor memory systems including the semiconductor memory devices that realize, among other features, a command/address reference voltage signal and a chip selection reference voltage signal that have different voltage values.

According to an aspect of the inventive concepts, there is provided a semiconductor memory device including a command/address input buffer that receives a command/address signal and a command/address reference voltage signal, wherein the command/address input buffer is configured to amplify a difference between the command/address signal and the command/address reference voltage signal, and is further configured to output the amplified difference between the command/address signal and the command/address reference voltage signal; and a chip selection input buffer that receives a chip selection signal and a chip selection reference voltage signal, wherein the chip selection input buffer is configured to amplify a difference between the chip selection signal and the chip selection reference voltage signal, and is further configured to output the amplified difference between the chip selection signal and the chip selection reference voltage signal, wherein a voltage level of the command/address reference voltage signal is different from a voltage level of the chip selection reference voltage signal.

In one embodiment, the command/address reference voltage signal and the chip selection reference voltage signal are transmitted to the semiconductor memory device via different transmission lines.

In another embodiment, the semiconductor memory device further includes a data input buffer that receives a data signal and a data reference voltage signal, wherein the data input buffer is configured to amplify a difference between the data signal and the data reference voltage signal, and is further configured to output the amplified difference between the data signal and the data reference voltage signal.

According to another aspect of the inventive concepts, there is provided a semiconductor memory module including a semiconductor memory unit that receives a command/address signal via a command/address bus, one or more chip selection signals via one or more chip selection buses, and a command/address reference voltage signal and a chip selection reference voltage signal from an external source; and a termination resistor unit connected to the semiconductor memory unit, the termination resistor unit comprising one or more termination resistor, wherein a voltage level of the command/address reference voltage signal is different from a voltage level of the chip selection reference voltage signal.

In one embodiment, the command/address reference voltage signal and the chip selection reference voltage signal are transmitted to the semiconductor memory unit via different transmission lines.

In another embodiment, the semiconductor memory unit includes one or more memory ranks, wherein the one or more chip selection signals determine whether to write data to or to read data from the one or more memory ranks by selecting a memory rank from among the one or more memory ranks, and wherein the one or more chip selection signals may be input to a corresponding one or more memory ranks, respectively.

In another embodiment, the one or more memory ranks include one or more semiconductor memory devices, respectively, and wherein each of the one or more semiconductor memory devices comprise: a command/address input buffer that receives the command/address signal and the command/address reference voltage signal, wherein the command/address input buffer is configured to amplify a difference between the command/address signal and the command/address reference voltage signal, and is further configured to output the amplified difference between the command/address signal and the command/address reference voltage signal; and a chip selection input buffer that receives the chip selection signal and the chip selection reference voltage signal that are input to each of the one or more memory ranks, wherein the chip selection input buffer is configured to amplify a difference between the chip selection signal and the chip selection reference voltage signal, and is further configured to output the amplified difference between the chip selection signal and the chip selection reference voltage signal.

In one embodiment, the one or more semiconductor memory devices are sequentially connected to the command/address bus.

In another embodiment, the one or more semiconductor memory devices, the termination resistor unit, the command/address bus, and the one or more chip selection buses are configured in a fly-by topology in which a transmission line is connected with components via short stubs, via a star-topology diverged from one or two divergence points, or via a T-topology diverged several times. In the star-topology or the T-topology, a level difference can occur between a reference voltage of the command/address signal and a reference voltage of the one or more chip selection signals, according to the number of termination resistors or the resistance values of the termination resistors.

In another embodiment, the termination resistor unit comprises: a first termination resistor unit connected to the command/address bus; and one or more second termination resistor units connected to the one or more chip selection buses.

In another embodiment, the first termination resistor comprises a first termination resistor connected between the command/address bus and a first power voltage.

In another embodiment, the first termination resistor unit comprises a second termination resistor connected between the command/address bus and a ground voltage.

In another embodiment, the first termination resistor unit comprises a first termination resistor connected between the command/address bus and a first power voltage; and a second termination resistor connected between the command/address bus and a second power voltage.

In another embodiment, the second power voltage is a ground voltage.

In another embodiment, the first termination resistor unit comprises a first switch having a first terminal connected to the command/address bus; a first termination resistor connected between a second terminal of the first switch and a first power voltage; a second switch having a first terminal connected to the command/address bus; and a second termination resistor connected between a second terminal of the second switch and a second power voltage.

According to another aspect of the inventive concepts, there is provided a semiconductor memory system including one or more semiconductor memory modules that receive a command/address signal, a chip selection signal, a command/address reference voltage signal, and a chip selection reference voltage signal; and a memory controller that generates and outputs the command/address signal, the chip selection signal, the command/address reference voltage signal, and the chip selection reference voltage signal to the one or more semiconductor memory modules, wherein a voltage level of the command/address reference voltage signal is different from a voltage level of the chip selection reference voltage signal. In the case of an on-board dynamic random access memory (DRAM), not a module, when the on-board DRAM has a fly-by topology, a star topology, or a T topology, a level difference may occur between a reference voltage of the command/address signal and a reference voltage of the chip selection signal, according to the number of termination resistors or the resistance values of the termination resistors.

In one embodiment, the one or more semiconductor memory modules are connected to the memory controller via a command/address bus, and the one or more semiconductor memory modules are connected to the memory controller via one or more chip selection buses, respectively.

In another embodiment, at least one of the one or more semiconductor memory modules are dummy memory modules.

In another embodiment, the dummy memory module comprises a termination resistor unit, and the dummy memory module is exclusive of a memory unit.

In another embodiment, the memory controller adjusts the voltage level of the command/address reference voltage signal according to the number of the one or more semiconductor memory modules that are connected to the command/address bus.

In another embodiment, the memory controller comprises a register unit for storing the voltage level of the command/address reference voltage signal corresponding to the number of the one or more semiconductor memory modules that are connected to the command/address bus.

In another embodiment, the memory controller determines a mid-value of a swing range of the command/address signal as the voltage level of the command/address reference voltage signal, and may determine a mid-value of a swing range of the chip selection signal as the voltage level of the chip selection reference voltage signal.

BRIEF DESCRIPTION OF THE DRAWINGS

The foregoing and other objects, features and advantages of embodiments of the present inventive concepts will be apparent from the more particular description of exemplary embodiments, as illustrated in the accompanying drawings in which like reference characters refer to the same elements throughout the different views. The drawings are not necessarily to scale, emphasis instead being placed upon illustrating the principles of the exemplary embodiments.

DETAILED DESCRIPTION OF THE EMBODIMENTS

Figure 1:
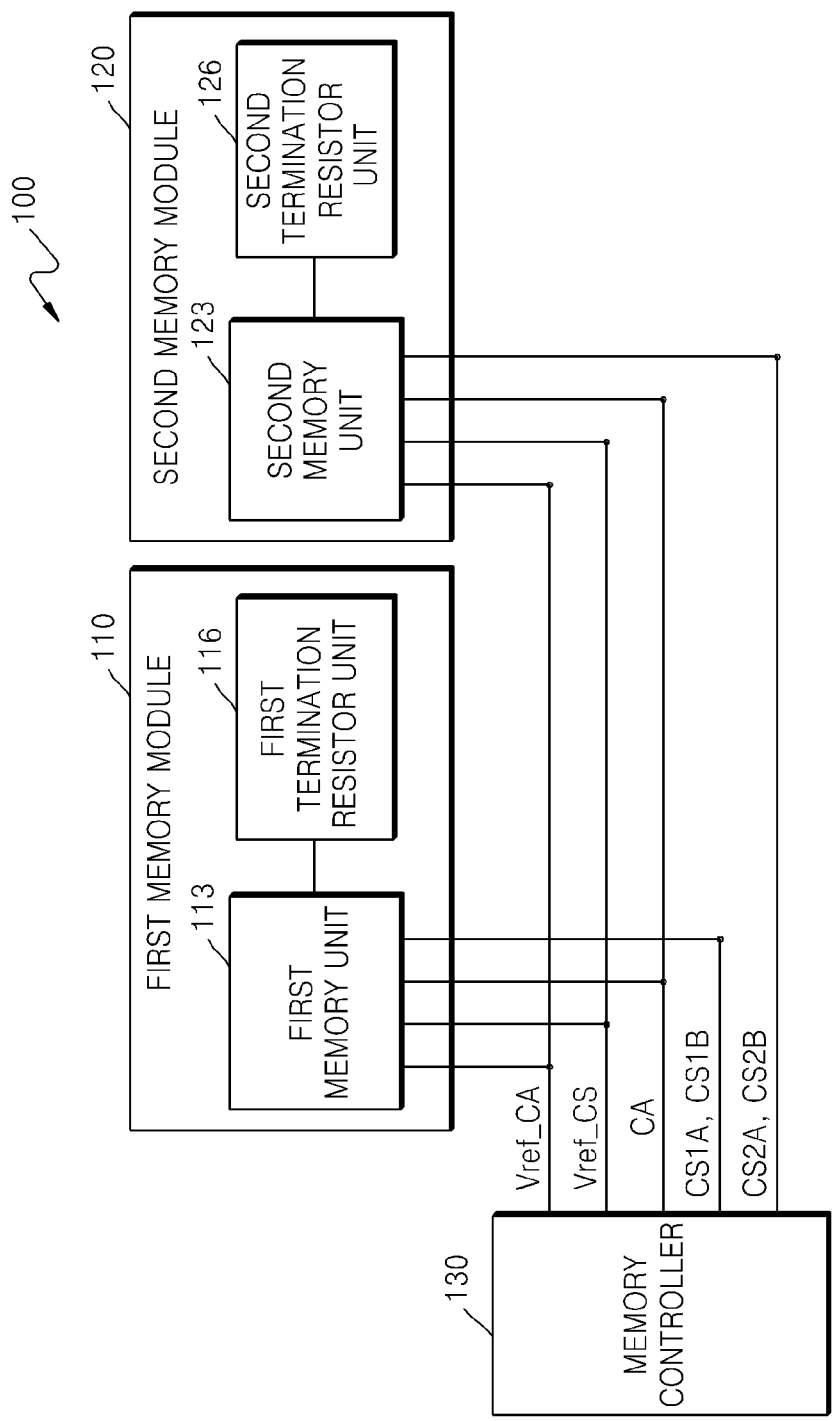
FIG. 1 is a block diagram of a semiconductor memory system in accordance with embodiments of the present inventive concepts.

Various exemplary embodiments will be described more fully hereinafter with reference to the accompanying drawings, in which some exemplary embodiments are shown. The present inventive concepts may, however, be embodied in many different forms and should not be construed as limited to the exemplary embodiments set forth herein.

It will be understood that when an element is referred to as being "on," "connected to" or "coupled to" another element, it can be directly on, connected or coupled to the other element or intervening elements may be present. In contrast, when an element is referred to as being "directly on," "directly connected to" or "directly coupled to" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular exemplary embodiments only and is not intended to be limiting of the present inventive concept. As used herein, the singular forms "a," "an" and "the" are intended to include the plural Runs as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Hereinafter, the inventive concepts will be described in detail by explaining exemplary embodiments of the inventive concepts with reference to the attached drawings. Like reference numerals in the drawings denote like elements.

FIG. 1 is a block diagram of a semiconductor memory system 100 in accordance with embodiments of the present inventive concepts. Referring to FIG. 1, the semiconductor memory system 100 can include a first memory module 110, a second memory module 120, and a memory controller 130. Although the semiconductor memory system 100 illustrated in FIG. 1 includes two memory modules, namely, the first and second memory modules 110 and 120, the number of memory modules is not limited thereto, and thus the semiconductor memory system 100 according to the present inventive concepts may include one or more memory modules. That is, the semiconductor memory system 100 can include 'n' number of memory modules, where 'n' is an integer value greater than or equal to 1 (i.e., $n \geq 1$).

The first memory module 110 can include a first memory unit 113 and a first termination resistor unit 116. The first memory unit 113 can include one or more memory ranks, and the one or more memory ranks can include a plurality of semiconductor memory devices, respectively. The first memory unit 113 can receive a command/address reference voltage signal Vref_CA, a chip selection reference voltage signal Vref_CS, a command/address signal CA, and first chip selection signals CS and CS1B from the memory controller 130.

In one embodiment, the semiconductor memory system 100 comprises a number of first chip selection signals corresponding to the number of memory ranks that are included in the first memory unit 113, and can be input to the first memory unit 113. For example, FIG. 1 corresponds specifically to a case in which the first memory unit 113 includes two memory ranks, and in this regard, two first chip selection signals are input to the first memory unit 113. That is, the first chip selection signal CS1A and the first chip selection signal CS can be input to the first memory unit 113.

The first termination resistor unit 116 can include a termination resistor, and can be connected to the first memory unit 113. Since the first termination resistor unit 116 is provided in the first memory module 110, the first termination resistor unit 116 can be a component corresponding to a module termination resistor.

The second memory module 120 can include a second memory unit 123 and a second termination resistor unit 126. The second memory unit 123 can include one or more memory ranks, and the one or more memory ranks can include a plurality of semiconductor memory devices, respectively. In addition, the second memory unit 123 can receive the command/address reference voltage signal Vref_CA, the chip selection reference voltage signal Vref_CS, the command/address signal CA, and second chip selection signals CS2A and CS2B from the memory controller 130. The second memory unit 123 can receive from the memory controller 130 the same signals as the first memory unit 113, except for receiving the second chip selection signals CS2A and CS2B in place of the first chip selection signals CS1A and CS1B.

In one embodiment, the semiconductor memory system 100 comprises a number of second chip selection signals corresponding to the number of memory ranks that are included in the second memory unit 123, and can be input to the second memory unit 123. For example, FIG. 1 corresponds to a case in which the second memory unit 123 includes two memory ranks, and in this regard, two second chip selection signals are input to the second memory unit 123. That is, the second chip selection signal CS2A and the second chip selection signal CS2B can be input to the second memory unit 123.

The memory controller 130 can be provided outside the first memory module 110 and the second memory module 120. The memory controller 130 can generate the command/address reference voltage signal Vref_CA, the chip selection reference voltage signal Vref_CS, the command/address signal CA, the first chip selection signals CS1A and CS1B, and the second chip selection signals CS2A and CS2B and/or can determine values of these signals, and can output the values to the first memory module 110 and the second memory module 120.

In one embodiment, the command/address signal CA can be a signal for indicating a command and a memory address that are input to the plurality of semiconductor memory devices included in the first memory unit 113 and the second memory unit 123.

The first and second chip selection signals CS1A, CS1B, CS2A and CS2B can be signals by which the memory controller 130 determines which memory rank of which memory module is to be selected. For example, in the case where the first memory module 110 and the second memory module 120 each include two memory ranks, respectively, when the first chip selection signal CS1A is enabled, a first memory rank of the first memory module 110 can be selected, and when the first chip selection signal CS is enabled, a second memory rank of the first memory module 110 can be selected. Further, when the second chip selection signal CS2A is enabled, a first memory rank of the second memory module 120 can be selected, and when the second chip selection signal CS2B is enabled, a second memory rank of the second memory module 120 can be selected. The first memory module 110 and the second memory module 120, which are each selected according to the first and second chip selection signals CS1A, CS1B, CS2A and CS2B, respectively, can perform a read operation or a write operation according to the command and memory address that are input via the command/address signal CA.

The command/address reference voltage signal Vref_CA can be a reference signal for determining whether the command/address signal CA is at a logic high state or at a logic low state. For example, when the command/address signal CA is input to a first input terminal of a comparator, and the command/address reference voltage signal Vref_CA is input to a second input terminal of the comparator, it is possible to determine a logic state of the command/address signal CA that is input to the first input terminal, according to a result output from the comparator. That is, when a voltage level of the command/address signal CA is higher than a voltage level of the command/address reference voltage signal Vref_CA, it can be determined that the command/address signal CA is at a logic high state, and when the voltage level of the command/address signal CA is lower than the voltage level of the command/address reference voltage signal Vref_CA, it can be determined that the command/address signal CA is at a logic low state.

The chip selection reference voltage signal Vref_CS can be a reference signal for determining whether the first and second chip selection signals CS1A, CS1B, CS2A and CS2B are at a logic high state or at a logic low state. For example, when the first and second chip selection signals CS1A, CS1B, CS2A and CS2B are input to a first input terminal of a comparator, and the chip selection reference voltage signal Vref_CS is input to a second input terminal of the comparator, it is possible to determine a logic state of the first and second chip selection signals CS1A, CS1B, CS2A and CS2B that are input to the first input terminal, according to a result output from the comparator. That is, when a voltage level of the first and second chip selection signals CS1A, CS1B, CS2A and CS2B are higher than a voltage level of the chip selection reference voltage signal Vref_CS, it can be determined that the first and second chip selection signals CS1A, CS1B, CS2A and CS2B are at a logic high state, and when the voltage level of the first and second chip selection signals CS1A, CS1B, CS2A and CS2B are lower than the voltage level of the chip selection reference voltage signal Vref_CS, it can be determined that the first and second chip selection signals CS1A, CS1B, CS2A and CS2B are at a logic low state.

As illustrated in FIG. 1, the command/address reference voltage signal Vref_CA and the chip selection reference voltage signal Vref_CS of the semiconductor memory system 100 can be transmitted to the first memory module 110 and the second memory module 120 via different transmission lines. Accordingly, the command/address reference voltage signal Vref_CA and the chip selection reference voltage signal Vref_CS can have different voltage levels.

Referring to FIG. 1, while a line for transmission of the command/address signal CA can be connected to both of the first memory module 110 and the second memory module 120, lines for transmission of the first chip selection signals CS1A and CS1B and the second chip selection signals CS2A and CS2B can each be separately connected to the first memory module 110 and the second memory module 120, respectively. That is, the first chip selection signals CS1A and CS1B can be connected to the first memory module 110, and the second chip selection signals CS2A and CS2B can be separately connected to the second memory module 120. Further, each of the first chip selection signals CS and CS can be connected to a memory rank of the one or more memory ranks of the first memory module 110. For example, the first chip selection signal CS can be connected to a first memory rank of the first memory module 110, and the first chip selection signal CS1B can be connected to a second memory rank of the first memory module 110. Further, each of the second chip selection signals CS2A and CS2B can be connected to a memory rank of the one or more memory ranks of the second memory module 120. For example, the second chip selection signal CS2A can be connected to a first memory rank of the second memory module 120, and the second chip selection signal CS2B can be connected to a second memory rank of the second memory module 120. Thus, while the line for transmission of the command/address signal CA is connected to the first termination resistor unit 116 via the first memory unit 113 and is also connected to the second termination resistor unit 126 via the second memory unit 123, the lines for transmission of the first chip selection signals CS and CS1B and the second chip selection signals CS2A and CS2B are each separately connected to the first termination resistor unit 116 via the first memory unit 113 and the second termination resistor unit 126 via the second memory unit 123, respectively. That is, the first chip selection signals CS1A and CS1B can be connected to the first termination resistor unit 116 via the first memory unit 113, and the second chip selection signals can be connected to the second termination resistor unit 126 via the second memory unit 123. In this manner, the number of termination resistor units that are connected to the line for transmission of the command/address signal CA differs from the number of termination resistor units that are connected to the lines for transmission of the first and second chip selection signals CS1A, CS1B, CS2A and CS2B, so that a termination resistance of the line for transmission of the command/address signal CA differs from a termination resistance of the lines for transmission of the first and second chip selection signals CS1A, CS1B, CS2A and CS2B. In this regard, when a termination resistance of a signal transmission line varies, a swing range of a transmitted signal also varies, so that a swing range of the command/address signal CA can be different from a swing range of the first and second chip selection signals CS1A, CS1B, CS2A and CS2B.

Further, when a voltage value of the command/address reference voltage signal Vref_CA is equal to a mid-value of the swing range of the command/address signal CA, a skew of the command/address signal CA can be minimized. Similarly, when a voltage value of the chip selection reference voltage signal Vref_CS is equal to a mid-value of the swing range of the first and second chip selection signals CS1A, CS1B, CS2A and CS2B, a skew of the first and second chip selection signals CS1A, CS1B, CS2A and CS2B can be minimized. Thus, if the command/address reference voltage signal Vref_CA and the chip selection reference voltage signal Vref_CS have the same voltage value when the swing range of the command/address signal CA is different from the swing range of the first and second chip selection signals CS1A, CS1B, CS2A and CS2B, the skew of the command/address signal CA or the skew of the first and second chip selection signals CS1A, CS1B, CS2A and CS2B may not be minimized. In this case, it may be necessary for the command/address reference voltage signal Vref_CA and the chip selection reference voltage signal Vref_CS to have different voltage values, such that the skew of the command/address signal CA and the skew of the first and second chip selection signals CS1A, CS1B, CS2A and CS2B can be minimized.

Furthermore, even when the semiconductor memory system 100 of FIG. 1 includes only one memory module, namely, the first memory module 110, if the first memory module 110 includes two or more memory ranks, a level difference can occur between a reference voltage of the command/address signal CA and a reference voltage of the first chip selection signals CS1A and CS1B, and thus it may be necessary for the command/address reference voltage signal Vref_CA and the chip selection reference voltage signal Vref_CS to have different voltage values.

Further, in the case of a registered Dual In-Line Memory Module (RDIMM) including a plurality of memory ranks, or a load reduced-DIMM (LRDIMM) including a plurality of memory ranks, in which a topology is not a simple fly-by topology, but is a fly-by topology such as a Y-topology including two branches, a level difference can occur between a reference voltage of the command/address signal CA and a reference voltage of the first chip selection signals CS1A, CS1B, and thus it may be necessary for the command/address reference voltage signal Vref_CA and the chip selection reference voltage signal Vref_CS to have different voltage values. Further, in the case of the RDIMM or the LRDIMM, the command/address signal CA and the first and second chip selection signals CS1A, CS1B, CS2A and CS2B can be re-driven in a register or in a memory buffer; however, it may be necessary to bring a reference voltage from the memory controller 130 or a motherboard including a voltage branch circuit.

Further, in the case where the semiconductor memory system 100 according to the present embodiment does not include a module, but includes an on-board dynamic random access memory (DRAM), when the on-board DRAM has a fly-by topology, a star topology, or a T topology, a level difference can occur between a reference voltage of the command/address signal CA and a reference voltage of the first and second chip selection signals CS1A, CS1B, CS2A and CS2B according to the number of termination resistors or the resistance values of the temiination resistors, so that it may be necessary for the command/address reference voltage signal Vref_CA and the chip selection reference voltage signal Vref_CS to have different voltage values.

In the semiconductor memory system 100 according to the present embodiment, the command/address reference voltage signal Vref_CA and the chip selection reference voltage signal Vref_CS can be transmitted via different transmission lines, and can have different voltage levels. Thus, as described above, even when the swing range of the command/address signal CA is different from the swing range of the first and second chip selection signals CS1A, CS1B, CS2A and CS2B, it is possible to separately set a voltage value of the command/address reference voltage signal Vref_CA, and a voltage value of the chip selection reference voltage signal Vref_CS that are suitable for the swing ranges of the command/address signal CA and the first and second chip selection signals CS1A, CS1B, CS2A and CS2B, respectively. For example, the voltage value of the command/address reference voltage signal Vref_CA can be the mid-value of the swing range of the command/address signal CA, and the voltage value of the chip selection reference voltage signal Vref_CS can be the mid-value of the swing range of the first and second chip selection signals CS1A, CS1B, CS2A and CS2B. In this case, the skew of the command/address signal CA and the skew of the first and second chip selection signals CS1A, CS1B, CS2A and CS2B can be minimized. The command/address reference voltage signal Vref_CA and the chip selection reference voltage signal Vref_CS can be set in the memory controller 130.

In addition, in FIG. 1, it is illustrated that the command/address reference voltage signal Vref_CA, the chip selection reference voltage signal Vref_CS, the command/address signal CA, and the first and second chip selection signals CS1A, CS1B, CS2A and CS2B are output from the memory controller 130; however, the present inventive concepts are not limited thereto, and the command/address reference voltage signal Vref_CA, the chip selection reference voltage signal Vref_CS, the command/address signal CA, and the first and second chip selection signals CS1A, CS1B, CS2A and CS2B can be generated in and output from another control device other than the memory controller 130.

In one embodiment, the semiconductor memory system 100 according to the present embodiment illustrated in FIG. 1 can be disposed on a motherboard. In this case, the first memory module 110 can be mounted to a first memory slot on the motherboard, and the second memory module 120 can be mounted to a second memory slot on the motherboard.

Meanwhile, in the case where the semiconductor memory system 100 according to the present embodiment includes only the first memory module 110, the line for transmission of the command/address signal CA is connected to only the first termination resistor unit 116 of the first memory module 110 so that the termination resistance of the line for transmission of the command/address signal CA may have a different termination resistance value, compared to a case in which the semiconductor memory system 100 includes one or more memory modules, for example, the case in which both of the first memory module 110 and the second memory module 120 are connected to the line for transmission of the command/address signal CA. Thus, in order to make the termination resistance of the line for transmission of the command/address signal CA have the same terminal resistance value as the case in which the semiconductor memory system 100 includes the first memory module 110 and the second memory module 120, although the semiconductor memory system 100 includes only the first memory module 110, the semiconductor memory system 100 may additionally include a dummy memory module in place of the second memory module 120.

In this case, the dummy memory module can indicate a memory module that does not include a memory unit, but only includes a termination resistor unit. That is, although only one memory module is actually included in the semiconductor memory system 100, in order to obtain the same terminal resistance value as the case in which two memory modules are included, the semiconductor memory system 100 may include the dummy memory module in place of the second memory module 120. In addition, the semiconductor memory system 100 can include the second memory module 120, and a dummy memory module in place of the first memory module 110.

When the semiconductor memory system 100 according to the present embodiment illustrated in FIG. 1 includes the dummy memory module in place of the second memory module 120, it is possible to maintain the termination resistance value of the line for transmission of the command/address signal CA, regardless of the number of memory modules mounted on the motherboard, and thus, it may not be necessary to change the voltage level of the command/address reference voltage signal Vref_CA.

Figure 2:
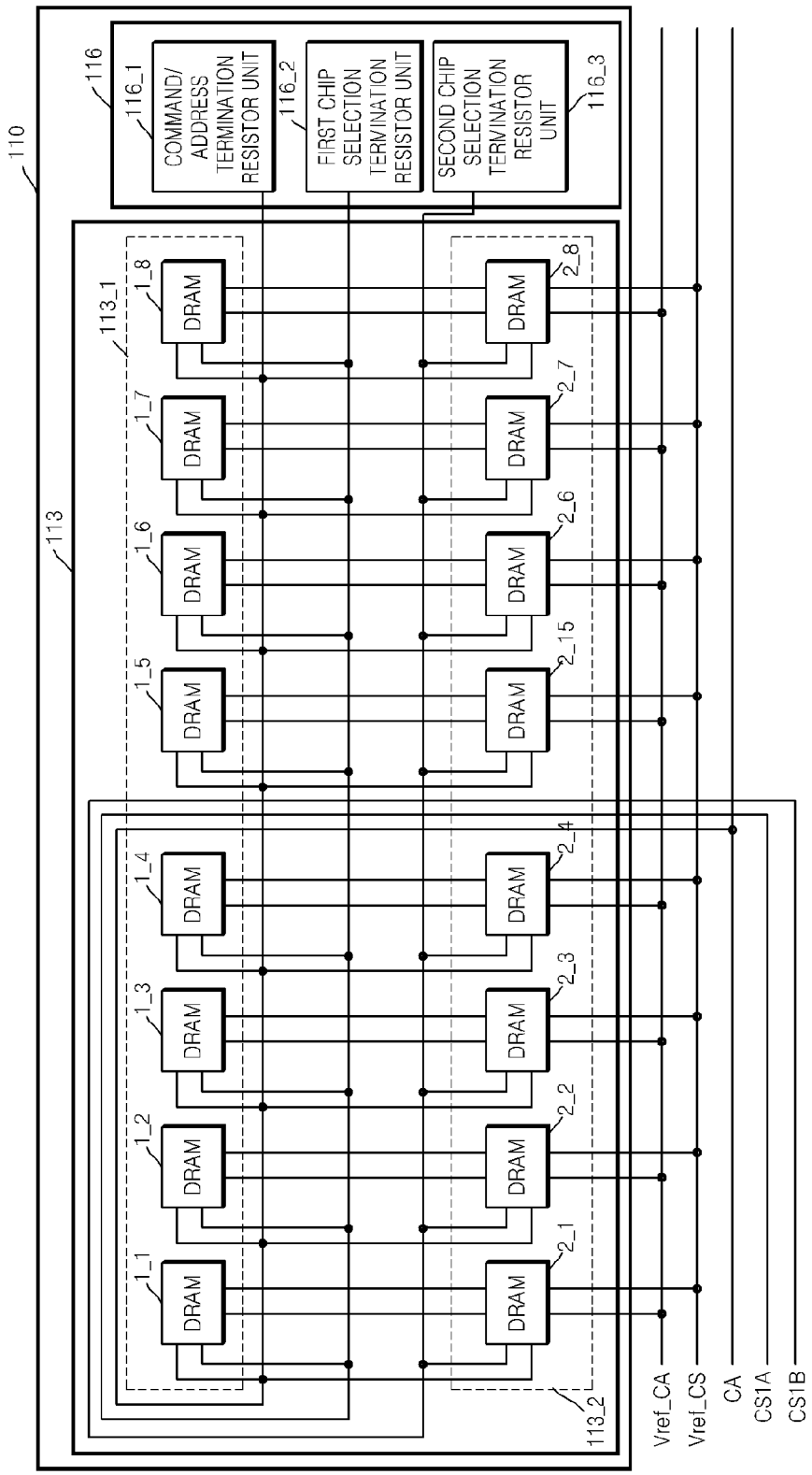
FIG. 2 is a detailed block diagram of a first memory module of the semiconductor memory system of FIG. 1 in accordance with embodiments of the present inventive concepts.

FIG. 2 is a detailed block diagram of the first memory module 110 included in the semiconductor memory system 100 of FIG. 1 in accordance with embodiments of the present inventive concepts. The second memory module 120 illustrated in FIG. 1 can have a similar configuration as the first memory module 110 of FIG. 2.

Referring to FIG. 2, the first memory module 110 can include the first memory unit 113 and the first termination resistor unit 116. The first memory unit 113 can include a first memory rank 113_1 and a second memory rank 113_2. In this exemplary embodiment, a memory rank may also be referred to as a memory bank. The first memory unit 113 can include the two memory ranks, namely, the first and second memory ranks 113_1 and 113_2; however, the number of memory ranks is not limited thereto, and thus the first memory unit 113 may include one or more memory ranks. That is the first memory unit 113 can include 'n' number of memory ranks, where 'n' is an integer value greater than or equal to 1 (i.e., n≧1).

Data is written to or read from the memory ranks 113_1 and 113_2 of the first memory module 110 by selecting a memory rank via the first chip selection signals CS1A and CS1B. For example, the first chip selection signal CS1A can select the first memory rank 113_1, and the first chip selection signal CS1B can select the second memory rank 113_2.

The first memory rank 113_1 can include a plurality of semiconductor memory devices 1_1, 1_2, 1_3, 1_4, 1_5, 1_6, 1_7, and 1_8. In a similar manner as the first memory rank 113_1, the second memory rank 113_2 can include a plurality of semiconductor memory devices 2_1, 2_2, 2_3, 2_4, 2_5, 2_6, 2_7, and 2_8. In FIG. 2, the first memory rank 113_1 and the second memory rank 113_2 each include 8 semiconductor memory devices, respectively; however, the number of semiconductor memory devices included in each of the first memory rank 113_1 and the second memory rank 113_2 is not limited thereto, and thus each of the first memory rank 113_1 and the second memory rank 113_2 can include one or more semiconductor memory devices. For example, an ECC DIMM can include the first memory rank 113_1 and the second memory rank 113_2, which each include 9 semiconductor memory devices, respectively.

The first termination resistor unit 116 can include a command/address termination resistor unit 116_1, a first chip selection termination resistor unit 116_2, and a second chip selection termination resistor unit 116_3. The command/address termination resistor unit 116_1 can be connected to each of the semiconductor memory devices 1_1 through 18, and 2_1 through 2_8 via a command/address bus for transmission of the command/address signal CA. The command/address termination resistor unit 116_1 can improve fidelity of the command/address signal CA by preventing reflection of the command/address signal CA transmitted via the command/address bus. The first chip selection termination resistor unit 116_2 can be connected to each of the semiconductor memory devices (1_1 through 1_8) of the first memory rank 113_1 via a first chip selection bus for transmission of the first chip selection signal CS1A. The first chip selection termination resistor unit 116_2 can improve fidelity of the first chip selection signal CS1A by preventing reflection of the first chip selection signal CS1A transmitted via the first chip selection bus. The second chip selection termination resistor unit 116_3 can be connected to each of the semiconductor memory devices (2_1 through 2_8) of the second memory rank 113_2 via a second chip selection bus for transmission of the first chip selection signal CS1B. Detailed configurations of the command/address termination resistor unit 116_1, the first chip selection termination resistor unit 116_2, and the second chip selection termination resistor unit 116_3 will be described in relation to FIGS. 4A through 4D.

Referring back to FIG. 2, the semiconductor memory devices (1_1 through 1_8) of the first memory rank 113_1 and the semiconductor memory devices (2_1 through 2_8) of the second memory rank 113_2 can be DRAMs. Each of the semiconductor memory devices 1_1 through 1_8, and 2_1 through 2_8 can each receive a command/address signal CA, the first chip selection signals CS1A and CS1B, a command/address reference voltage signal Vref_CA, and a chip selection reference voltage signal Vref_CS from an external source, such as, the memory controller 130 in FIG. 1. As illustrated in FIG. 2, the command/address signal CA can be input to the semiconductor memory devices 1_1 through 1_8, and 2_1 through 2_8 in a sequential manner via the command/address bus. The first chip selection signal CS1A can be input to the semiconductor memory devices (1_1 through 1_8) of the first memory rank 113_1 in a sequential manner, and the second chip selection signal CS can be input to the semiconductor memory devices (2_1 through 2_8) of the second memory rank 113_2 in a sequential manner.

The command/address signal CA, the first chip selection signals CS and CS1B, the second chip selection signals CS2A and CS2B, the command/address reference voltage signal Vref_CA, and the chip selection reference voltage signal Vref_CS can be output from the memory controller 130. The first chip selection signals CS1A and CS1B may be input only to the first memory module 110 and may not be input to the second memory module 120, and the second chip selection signals CS2A and CS2B may be input only to the second memory module 120 and may not be input to the first memory module 110. However, the command/address signal CA, the command/address reference voltage signal Vref_CA, and the chip selection reference voltage signal Vref_CS can be input to each of the first memory module 110 and the second memory module 120.

FIG. 2 corresponds to an unbuffered DIMM (UDIMM) memory module having a fly-by topology. In this embodiment, the fly-by topology may indicate a topology in which a transmission line is connected with components via short stubs. A design of the fly-by topology is not limiting of FIG. 2, and thus it would have been obvious to one of ordinary skill in the art to vary connections of lines for transmission of the command/address signal CA, the first chip selection signals CS1A and CS1B, the command/address reference voltage signal Vref_CA, and the chip selection reference voltage signal Vref_CS, and the disposition of the semiconductor memory devices (1_1 through 1_8 and 2_1 through 2_8), and the first termination resistor unit 116. For example, in another embodiment, a memory module may include a star-topology in which branches diverge from one or two points, or a T-topology in which branches diverge several times. In the star-topology or the T-topology, a level difference may occur between a reference voltage of the command/address signal CA and a reference voltage of the first chip selection signals CS1A and CS1B, according to the number of termination resistors or the resistance values of the termination resistors.

Figure 3:
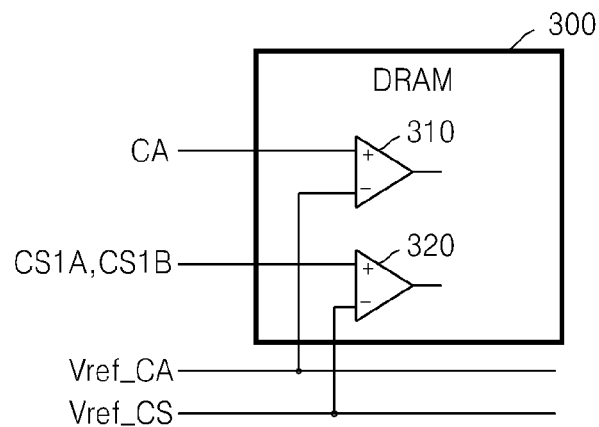
FIG. 3 is a schematic diagram of a semiconductor memory device in accordance with embodiments of the present inventive concepts.

FIG. 3 is a schematic diagram of a semiconductor memory device 300 in accordance with embodiments of the present inventive concepts. The semiconductor memory device 300 can be one of the semiconductor memory devices 1_1 through 18, and 2_1 through 2_8 of FIG. 2. Referring to FIG. 3, the semiconductor memory device 300 can include a command/address input buffer 310 and a chip selection input buffer 320. The semiconductor memory device 300 can receive a command/address signal CA via a command/address bus, and may receive first chip selection signals CS1A and CS1B via a first chip selection bus and a second chip selection bus, respectively. Further, the semiconductor memory device 300 can receive a command/address reference voltage signal Vref_CA and a chip selection reference voltage signal Vref_CS from the memory controller 130, or other external device.

The command/address input buffer 310 can receive the command/address signal CA through its first input terminal, and can further receive the command/address reference voltage signal Vref_CA through its second input terminal. In one embodiment, the first input terminal of the command/address input buffer 310 can be a positive '+' input terminal and the second input terminal of the command/address input buffer 310 can be a negative '−' input terminal. The command/address input buffer 310 can amplify a voltage difference between the command/address signal CA and the command/address reference voltage signal Vref_CA and can output the amplified voltage difference.

According to a result output from the command/address input buffer 310, it is possible to determine a logic state of the command/address signal CA that is input to the first input terminal. That is, when a voltage level of the command/address signal CA is higher than a voltage level of the command/address reference voltage signal Vref_CA, it can be determined that the command/address signal CA is at a logic high state, and when the voltage level of the command/address signal CA is lower than the voltage level of the command/address reference voltage signal Vref_CA, it can be determined that the command/address signal CA is at a logic low state. The output from the command/address input buffer 310 can be used to control a write operation or a read operation of the semiconductor memory device 300.

The chip selection input buffer 320 can receive either of the first chip selection signals CS1A and CS through its first input terminal, and can further receive the chip selection reference voltage signal Vref_CS through its second input terminal. In one embodiment, the first input terminal of the chip selection input buffer 320 can be a positive '+' input terminal and the second input terminal of the chip selection input buffer 320 can be a negative '−' input terminal. In the case where the semiconductor memory device 300 is included in the first memory rank 113_1 illustrated in FIG. 2, the chip selection input buffer 320 can receive the first chip selection signal CS1A, and in the case where the semiconductor memory device 300 is included in the second memory rank 113_2 illustrated in FIG. 2, the chip selection input buffer 320 can receive the first chip selection signal CS1B. The chip selection input buffer 320 can amplify a voltage difference between either of the first chip selection signals CS and CS1B, and the chip selection reference voltage signal Vref_CS, and can output the amplified voltage difference. In the case where the semiconductor memory device 300 is included in the second memory module 120, the chip selection input buffer 320 can receive either of second chip selection signals CS2A and CS2B, in place of either of the first chip selection signals CS1A and CS1B.

According to a result output from the chip selection input buffer 320, it is possible to determine a logic state of the first chip selection signals CS1A and CS1B that are input to the first input terminal. That is, when a voltage level of the chip selection signals CS1A and CS is higher than a voltage level of the chip selection reference voltage signal Vref_CS, it can be determined that the chip selection signals CS1A and CS1B are at a logic high state, and when the voltage level of the chip selection signals CS1A and CS1B is lower than the voltage level of the chip selection reference voltage signal Vref_CS, it can be determined that the chip selection signals CS1A and CS1B are at a logic low state. The output from the chip selection input buffer 320 can be used to control a write operation or a read operation of the semiconductor memory device 300.

As described with reference to FIG. 1, the command/address reference voltage signal Vref_CA and the chip selection reference voltage signal Vref_CS can be input to the semiconductor memory device 300 via different lines or buses, and can have different voltage level values.

Figure 4A:
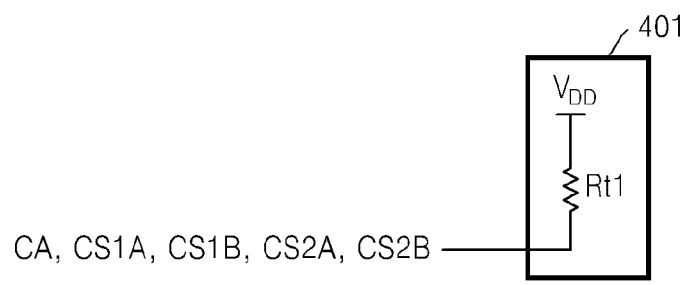
FIG. 4A is a schematic diagram of a termination resistor unit in accordance with embodiments of the present inventive concepts.

FIG. 4A is a schematic diagram of a termination resistor unit 401 in accordance with embodiments of the present inventive concepts. The termination resistor unit 401 can be an example of the command/address termination resistor unit 116_1, and/or the first and second chip selection termination resistor units 116_2 and 116_3, which are illustrated in FIG. 2.

Referring to FIG. 4A, the termination resistor unit 401 can include a first termination resistor Rt1. The first termination resistor Rt1 can have a first terminal connected to the command address bus for transmission of the command/address signal CA or to either of the chip selection buses for transmission of the first and second chip selection signals CS1A, CS1B, CS2A, and CS2B, and can have a second terminal connected to a power voltage VDD. In this configuration, the termination resistor unit 401 can use the power voltage VDD as a termination voltage.

Figure 4B:
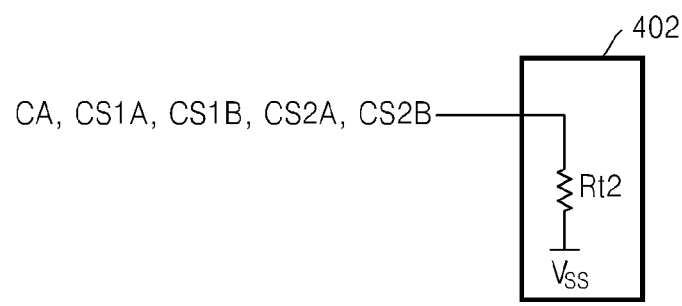
FIG. 4B is a schematic diagram of a termination resistor unit in accordance with embodiments of the present inventive concepts.

FIG. 4B is a schematic diagram of a termination resistor unit 402 in accordance with embodiments of the present inventive concepts. The termination resistor unit 402 can be another example of the command/address termination resistor unit 116_1, and/or the first and second chip selection termination resistor units 116_2 and 116_3, which are illustrated in FIG. 2.

Referring to FIG. 4B, the termination resistor unit 402 can include a second termination resistor Rt2. The second termination resistor Rt2 can have a first terminal connected to the command address bus for transmission of the command/address signal CA or to either of the chip selection buses for transmission of the first and second chip selection signals CS1A, CS1B, CS2A, and CS2B, and can have a second terminal connected to a ground voltage VSS. In this configuration, the termination resistor unit 402 can use the ground voltage VSS as a termination voltage.

Figure 4C:
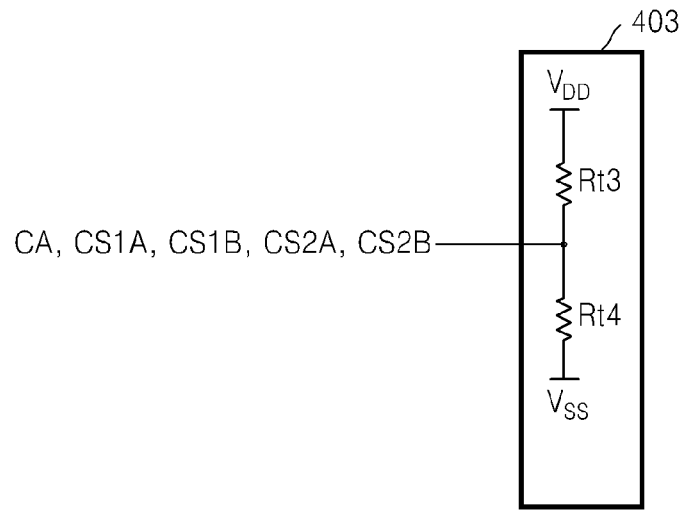
FIG. 4C is a schematic diagram of a termination resistor unit in accordance with embodiments of the present inventive concepts.

FIG. 4C is a schematic diagram of a termination resistor unit 403 in accordance with embodiments of the present inventive concepts. The termination resistor unit 403 can be another example of the command/address termination resistor unit 116_1, and/or the first and second chip selection termination resistor units 116_2 and 116_3, which are illustrated in FIG. 2.

Referring to FIG. 4C, the termination resistor unit 403 can include a third termination resistor Rt3 and a fourth termination resistor Rt4. The third termination resistor Rt3 may have a first terminal connected to the command address bus for transmission of the command/address signal CA or to either of the chip selection buses for transmission of the first and second chip selection signals CS1A, CS1B, CS2A, and CS2B, and can have a second terminal connected to a power voltage VDD. The fourth termination resistor Rt4 can have a first terminal connected to the command address bus for transmission of the command/address signal CA or to either of the chip selection buses for transmission of the first and second chip selection signals CS1A, CS1B, CS2A, and CS2B, and can have a second terminal connected to a ground voltage VSS. The termination resistor unit 403 of FIG. 4C can correspond to a center tap termination type termination resistor unit in which the third termination resistor Rt3 and the fourth termination resistor Rt4 can have the same resistance value.

Figure 4D:
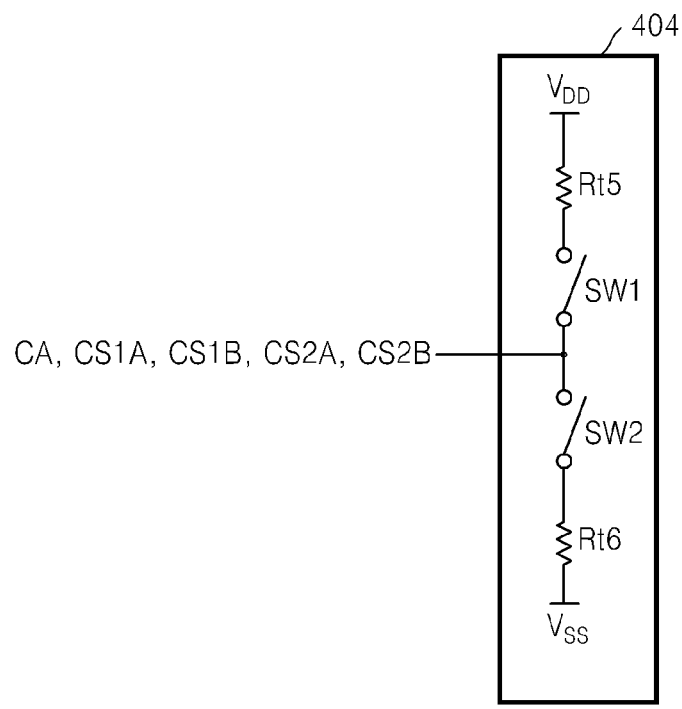
FIG. 4D is a schematic diagram of a termination resistor unit in accordance with embodiments of the present inventive concepts.

FIG. 4D is a schematic diagram of a termination resistor unit 404 in accordance with embodiments of the present inventive concepts. The termination resistor unit 404 can be another example of the command/address termination resistor unit 116_1, and/or the first and second chip selection termination resistor units 116_2 and 116_3, which are illustrated in FIG. 2.

The termination resistor unit 404 can include a fifth termination resistor Rt5, a sixth termination resistor Rt6, a first switch SW1, and a second switch SW2. The first switch SW1 can have a first terminal that can be connected to a command/ address bus for transmission of the command/address signal CA or to either of the chip selection buses for transmission of the first and second chip selection signals CS1A, CS1B, CS2A, and CS2B, and can have a second terminal that can be connected to the fifth termination resistor Rt5. The fifth termination resistor Rt5 can be connected between the first switch SW1 and a power voltage VDD. The second switch SW2 can have a first terminal that can be connected to the command/address bus for transmission of the command/address signal CA or either of the chip selection buses for transmission of the first and second chip selection signals CS1A, CS1B, CS2A, and CS2B, and can have a second terminal that can be connected to the sixth termination resistor Rt6. The sixth termination resistor Rt6 can be connected between the second switch SW2 and a ground voltage VSS.

In this exemplary embodiment, the first switch SW1 and the second switch SW2 can be controlled by a separate control device (not shown), which can turn on or off the first and second switches SW1 and SW2. Accordingly, the termination resistor unit 404 of FIG. 4D can be operated in various manners according to whether the first switch SW1 and the second switch SW2 are turned on or off.

Figure 5:
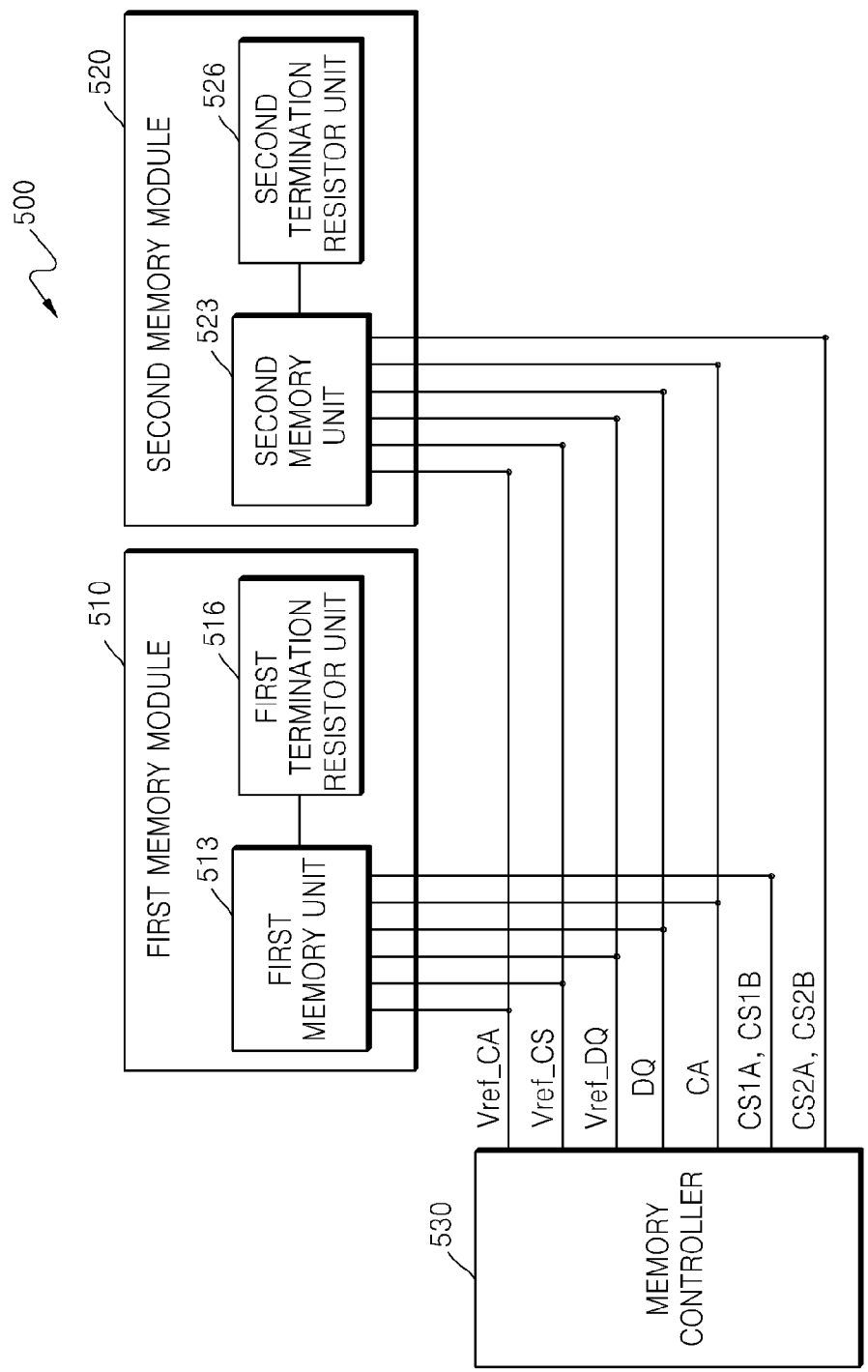
FIG. 5 is a block diagram of a semiconductor memory system in accordance with embodiments of the present inventive concepts.

FIG. 5 is a block diagram of a semiconductor memory system 500 in accordance with embodiments of the present inventive concepts. Referring to FIG. 5, the semiconductor memory system 500 can include a first memory module 510, a second memory module 520, and a memory controller 530.

Signals and elements having the same functions as those illustrated in FIG. 1 are indicated by like reference identifiers, and thus their detailed description will be omitted.

The semiconductor memory system 500 includes a data bus for transmission of a data signal DQ and a data reference voltage transmission line or bus for transmission of a data reference voltage signal Vref_DQ. The data bus and data reference voltage transmission line can be connected between the memory controller 530 and the first and second memory modules 510 and 520.

It is possible to write data to or to read data from semiconductor memory devices that are included in the first and second memory modules 510 and 520, via the data bus. Further, the data reference voltage signal Vref_DQ can be input to the semiconductor memory devices that are included in the first and second memory modules 510 and 520.

Figure 6:
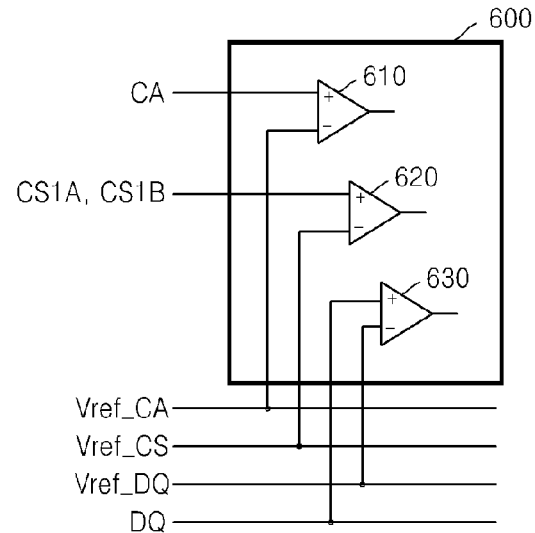
FIG. 6 is a schematic diagram of a semiconductor memory device in accordance with embodiments of the present inventive concepts.

FIG. 6 is a schematic diagram of a semiconductor memory device 600 in accordance with embodiments of the present inventive concepts. The semiconductor memory device 600 can be one of the semiconductor memory devices included in the first and second memory modules 510 and 520 of FIG. 5.

Referring to FIG. 6, the semiconductor memory device 600 can include a command/address input buffer 610 and a chip selection buffer 620, in a similar manner to the semiconductor memory device 300 of FIG. 3. Configurations and operations of the command/address input buffer 610 and the chip selection buffer 620 are similar to the command/address input buffer 310 and the chip selection buffer 320 described in relation to FIG. 3, and thus detailed descriptions thereof will be omitted.

The semiconductor memory device 600 can further include a data input buffer 630. The data input buffer 630 can receive the data signal DQ through its first input terminal via the data bus, and can receive the data reference voltage signal Vref_DQ through its second input terminal via the data reference voltage transmission line. In one embodiment, the first input terminal of the data input buffer 630 can be a positive '+' input terminal and the second input terminal of the data input buffer 630 can be a negative '−' input terminal. The data input buffer 630 can amplify a difference between the data signal DQ and the data reference voltage signal Vref_DQ, and can output the amplified difference. According to a result output from the data input buffer 630, it is possible to determine a logic state of the data signal DQ, and the output from the data input buffer 630 can be used in a write operation of the semiconductor memory device 600.

The data signal DQ and the data reference voltage signal Vref_DQ can be output from the memory controller 530. Further, the command/address reference voltage signal Vref_CA, the chip selection reference voltage signal Vref_CS and the data reference voltage signal Vref_DQ can be input to the semiconductor memory device 600 via difference lines or buses, and can each have different voltage level values.

Figure 7:
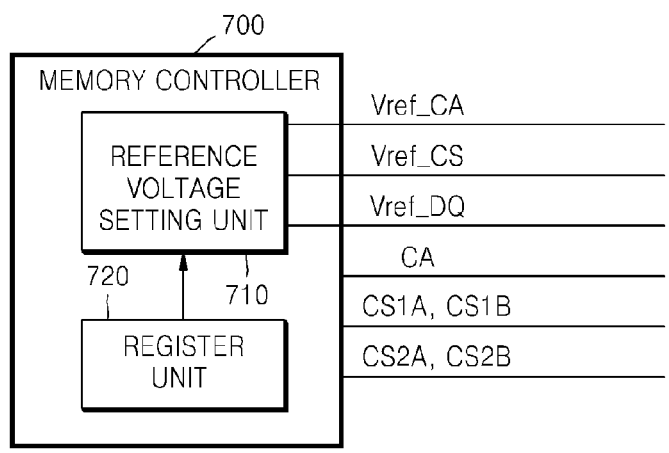
FIG. 7 is a block diagram of a memory controller in accordance with embodiments of the present inventive concepts.

FIG. 7 is a block diagram of a memory controller 700 in accordance with embodiments of the present inventive concepts. The memory controller 700 can be an example of the memory controllers 130 and 530 that are illustrated in FIGS. 1 and 5, respectively.

The memory controller 700 can include a reference voltage setting unit 710 and a register unit 720. The reference voltage setting unit 710 can adjust a voltage level of the command/address reference voltage signal Vref_CA according to the number of memory modules that are connected to the memory controller 700. Further, the reference voltage setting unit 710 can adjust a voltage level of the data reference voltage signal Vref_DQ according to the number of memory modules that are connected to the memory controller 700. The register unit 720 can store the voltage level of the command/address reference voltage signal Vref_CA that corresponds to the number of memory modules that are connected to the memory controller 700. Further, the register unit 720 can store the voltage level of the data reference voltage signal Vref_DQ that corresponds to the number of memory modules that are connected to the memory controller 700.

In addition, the reference voltage setting unit 710 can adjust a voltage level of the chip selection voltage signal Vref_CS, and the register unit 720 can store the voltage level of the chip selection reference voltage signal Vref_CS.

After measuring a mid-value of a swing range of a command/address signal CA according to the number of the memory modules connected to the memory controller 700, via a test procedure of the memory modules, a result of the measurement can be stored in the register unit 720 as information regarding the voltage level of the command/address reference voltage signal Vref_CA that corresponds to the number of memory modules.

Further, in order to measure a termination resistance value of a command/address bus for transmission of the command/address signal CA, the reference voltage setting unit 710 can detect the number of memory modules that are connected to the memory controller 700. In addition, the reference voltage setting unit 710 can read memory rank information from an Electrically Erasable Programmable Read-Only Memory (EEPROM) of a DIMM connected to the memory controller 700, and thus can detect the number of memory modules that are connected to the memory controller 700.

That is, the reference voltage setting unit 710 can detect the number of memory modules connected to the memory controller 700, can receive the information regarding the voltage level of the command/address reference voltage signal Vref_CA that corresponds to the number of memory modules from the register unit 720, and thus can set the voltage level of the command/address reference voltage signal Vref_CA.

Figure 8:
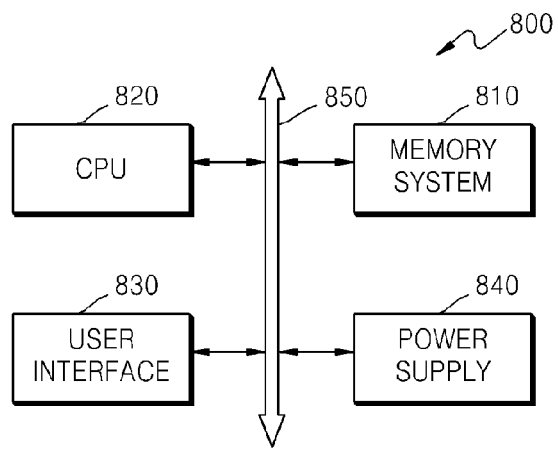
FIG. 8 is a block diagram of a computing system including a semiconductor memory system in accordance with embodiments of the present inventive concepts.

FIG. 8 is a block diagram of a computing system 800 including a semiconductor memory system 810 in accordance with embodiments of the present inventive concepts.

Referring to FIG. 8, the computing system 800 can include the semiconductor memory system 810, a processor 820, such as a central processing unit (CPU) or microprocessor, a user interface 830, and a power supply device 840, which are electrically connected to each other via a bus 850.

The semiconductor memory system 810 has been described with reference to those of FIGS. 1 and 5, and thus a detailed description thereof is omitted here. Since configurations and operations of the processor 820, the user interface 830, and the power supply device 840 are well known to one of ordinary skill in the art, detailed descriptions thereof are omitted. In the case where the computing system 800 according to the present embodiment is a mobile apparatus, a battery for the supply of an operating voltage for the computing system 800 may be further included.

Meanwhile, the semiconductor memory device, the semiconductor memory module or the semiconductor memory system according to the one or more embodiments of the present inventive concepts may be mounted by using various types of packages. For example, the semiconductor memory device, the semiconductor memory module, or the semiconductor memory system according to the one or more embodiments of the present inventive concepts can be mounted by using one of packages including a Package on Package (POP), Ball grid array (BGA) package, Chip scale package (CSP), Plastic Leaded Chip Carrier (PLCC) package, Plastic Dual In-Line Package (PDIP), Die in Waffle Pack package, Die in Wafer Form package, Chip On Board (COB) package, Ceramic Dual In-Line Package (CERDIP), Plastic Metric Quad Flat Pack (MQFP) package, Thin Quad Flatpack (TQFP) package, Small Outline (SOIC) package, Shrink Small Outline Package (SSOP), Thin Small Outline (TSOP) package, Thin Quad Flatpack (TQFP) package, System In Package (SIP), Multi Chip Package (MCP), Wafer-level Fabricated Package (WFP), or Wafer-Level Processed Stack Package (WSP). Further, the semiconductor memory device, the semiconductor memory module, or the semiconductor memory system according to the one or more embodiments of the present inventive concepts can be mounted by using one of the stacked packages including a Dual-Die Package (DDP), Quad-Die Package (QDP) or Through Silicon Via (TSV) package.

While the inventive concepts have been particularly shown and described with reference to exemplary embodiments thereof, it will be understood that various changes in form and details may be made therein without departing from the spirit and scope of the following claims.

What is claimed is:

1. A semiconductor memory device comprising:
a command/address input buffer that receives a command/address signal and a command/address reference voltage signal, wherein the command/address input buffer is configured to amplify a difference between the command/address signal and the command/address reference voltage signal, and is further configured to output the amplified difference between the command/address signal and the command/address reference voltage signal; and
a chip selection input buffer that receives a chip selection signal and a chip selection reference voltage signal, wherein the chip selection input buffer is configured to amplify a difference between the chip selection signal and the chip selection reference voltage signal, and is further configured to output the amplified difference between the chip selection signal and the chip selection reference voltage signal,
wherein the command/address signal is transmitted via a command/address bus commonly connected to a plurality of semiconductor memory devices and the chip selection signal is transmitted via a chip selection bus connected to a subset of the plurality of semiconductor memory devices, and
wherein a voltage level of the command/address reference voltage signal is different from a voltage level of the chip selection reference voltage signal.

2. The semiconductor memory device of claim 1, wherein the command/address reference voltage signal and the chip selection reference voltage signal are transmitted to the semiconductor memory device via different transmission lines.

3. The semiconductor memory device of claim 1, further comprising a data input buffer that receives a data signal and a data reference voltage signal, wherein the data input buffer is configured to amplify a difference between the data signal and the data reference voltage signal, and is further configured to output the amplified difference between the data signal and the data reference voltage signal.

4. A semiconductor memory module comprising:
a semiconductor memory unit that receives a command/address signal via a command/address bus, one or more chip selection signals via one or more chip selection buses, and a command/address reference voltage signal and a chip selection reference voltage signal from an external source; and
a termination resistor unit connected to the semiconductor memory unit, the termination resistor unit comprising one or more termination resistors,
wherein the command/address signal is transmitted via a command/address bus commonly connected to a plurality of semiconductor memory devices and the one or more chip selection signals are transmitted via the one or more chip selection buses connected to each subset of the plurality of semiconductor memory devices, and
wherein a voltage level of the command/address reference voltage signal is different from a voltage level of the chip selection reference voltage signal.

5. The semiconductor memory module of claim 4, wherein the command/address reference voltage signal and the chip selection reference voltage signal are transmitted to the semiconductor memory unit via different transmission lines.

6. The semiconductor memory module of claim 4, wherein the semiconductor memory unit comprises one or more memory ranks,
wherein the one or more chip selection signals determine whether to write data to or to read from the one or more memory ranks by selecting a memory rank from among the one or more memory ranks, and
wherein the one or more chip selection signals are input to a corresponding one or more memory ranks, respectively.

7. The semiconductor memory module of claim 6, wherein the one or more memory ranks comprise one or more semiconductor memory devices, respectively, and
wherein each of the one or more semiconductor memory devices comprise:
a command/address input buffer that receives the command/address signal and the command/address reference voltage signal, wherein the command/address input buffer is configured to amplify a difference between the command/address signal and the command/address reference voltage signal, and is further configured to output the amplified difference between the command/address signal and the command/address reference voltage signal; and a chip selection input buffer that receives the chip selection signal and the chip selection reference voltage signal that are input to each of the one or more memory ranks, wherein the chip selection input buffer is configured to amplify a difference between the chip selection signal and the chip selection reference voltage signal, and is further configured to output the amplified difference between the chip selection signal and the chip selection reference voltage signal.

8. The semiconductor memory module of claim 7, wherein the one or more semiconductor memory devices are sequentially connected to the command/address bus.

9. The semiconductor memory module of claim 7, wherein the one or more semiconductor memory devices, the termination resistor unit, the command/address bus, and the one or more chip selection buses are configured in a fly-by topology.

10. The semiconductor memory module of claim 4, wherein the termination resistor unit comprises:
a first termination resistor unit connected to the command/address bus; and
one or more second termination resistor units connected to the one or more chip selection buses.

11. The semiconductor memory module of claim 10, wherein the first termination resistor unit comprises a first termination resistor connected between the command/address bus and a first power voltage.

12. The semiconductor memory module of claim 10, wherein the first termination resistor unit comprises a second termination resistor connected between the command/address bus and a ground voltage.

13. The semiconductor memory module of claim 10, wherein the first termination resistor unit comprises:
a first termination resistor connected between the command/address bus and a first power voltage; and
a second termination resistor connected between the command/address bus and a second power voltage.

14. The semiconductor memory module of claim 13, wherein the second power voltage is a ground voltage.

15. The semiconductor memory module of claim 10, wherein the first termination resistor unit comprises:
a first switch having a first terminal connected to the command/address bus;
a first termination resistor connected between a second terminal of the first switch and a first power voltage;
a second switch having a first terminal connected to the command/address bus; and
a second termination resistor connected between a second terminal of the second switch and a second power voltage.

16. A semiconductor memory system comprising:
one or more semiconductor memory modules that receive a command/address signal, a chip selection signal, a command/address reference voltage signal, and a chip selection reference voltage signal; and
a memory controller that generates and outputs the command/address signal, the chip selection signal, the command/address reference voltage signal, and the chip selection reference voltage signal to the one or more semiconductor memory modules,
wherein the command/address signal is transmitted via a command/address bus commonly connected to a plurality of semiconductor memory devices in the one or more semiconductor memory modules and the chip selection signal is transmitted via a chip selection bus connected to a subset of the plurality of semiconductor memory devices, and
wherein a voltage level of the command/address reference voltage signal is different from a voltage level of the chip selection reference voltage signal.

17. The semiconductor memory system of claim 16, wherein the one or more semiconductor memory modules are connected to the memory controller via a command/address bus, and
wherein the one or more semiconductor memory modules are connected to the memory controller via one or more chip selection buses, respectively.

18. The semiconductor memory system of claim 16, wherein at least one of the one or more semiconductor memory modules are dummy memory modules.

19. The semiconductor memory system of claim 18, wherein the dummy memory module comprises a termination resistor unit, and wherein the dummy memory module is exclusive of a memory unit.

20. The semiconductor memory system of claim 16, wherein the memory controller adjusts the voltage level of the command/address reference voltage signal according to the number of the one or more semiconductor memory modules that are connected to the command/address bus.

21. The semiconductor memory system of claim 20, wherein the memory controller comprises a register unit for storing the voltage level of the command/address reference voltage signal that corresponds to the number of the one or more semiconductor memory modules that are connected to the command/address bus.

22. The semiconductor memory system of claim 16, wherein the memory controller determines a mid-value of a swing range of the command/address signal as the voltage level of the command/address reference voltage signal, and determines a mid-value of a swing range of the chip selection signal as the voltage level of the chip selection reference voltage signal.

* * * * *